US012777589B2

(12) United States Patent
Sugiyama

(10) Patent No.: US 12,777,589 B2
(45) Date of Patent: Oct. 27, 2026

(54) OPTICAL MODULE AND OPTICAL TRANSCEIVER

(71) Applicant: FUJITSU OPTICAL COMPONENTS LIMITED, Kawasaki (JP)

(72) Inventor: Masaki Sugiyama, Kawasaki (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 212 days.

(21) Appl. No.: 18/666,312

(22) Filed: May 16, 2024

(65) Prior Publication Data

US 2024/0407104 A1 Dec. 5, 2024

(30) Foreign Application Priority Data

May 31, 2023 (JP) ................................ 2023-090151

(51) Int. Cl.

| | |
|---|---|
| ***H05K 1/18*** | (2026.01) |
| ***G02F 1/035*** | (2006.01) |
| ***H01R 12/62*** | (2011.01) |
| ***H05K 1/02*** | (2006.01) |
| ***H05K 1/189*** | (2026.01) |

(52) U.S. Cl.

CPC .......... *H05K 1/189* (2013.01); *G02F 1/0356* (2013.01); *H01R 12/62* (2013.01); *H05K 1/025* (2013.01); *H05K 2201/09827* (2013.01)

(58) Field of Classification Search

CPC .................. H05K 1/189; H05K 1/025; H05K 2201/09827; G02F 1/0356; H01R 12/62

USPC ........................................................ 361/749

See application file for complete search history.

(56) References Cited

U.S. PATENT DOCUMENTS

| | | | | |
|---|---|---|---|---|
| 12,176,959 | B2 * | 12/2024 | Ogiso | H04B 10/25759 |
| 2007/0102830 | A1 * | 5/2007 | Muto | H05K 1/118 257/784 |
| 2016/0356955 | A1 * | 12/2016 | Sugiyama | G02F 1/2255 |

FOREIGN PATENT DOCUMENTS

| | | |
|---|---|---|
| JP | 2007-123741 | 5/2007 |
| JP | 2017-003655 | 1/2017 |

* cited by examiner

*Primary Examiner* — Binh B Tran

(74) *Attorney, Agent, or Firm* — STAAS & HALSEY LLP

(57) ABSTRACT

An optical module includes a first component, a second component, and an FPC that electrically connects the first component and the second component. The FPC includes a signal pad, a ground pad, a signal line, a ground pattern, a first coverlay including a first protrusion part, and a second coverlay including a second protrusion part. The first protrusion part covers a region on the FPC where the signal line is disposed, and protrudes at a location where the signal pad is disposed, toward an end part of the FPC on the first component side than the region where the signal line is disposed. The second protrusion part protrudes at a location where the signal pad is disposed, toward an end part of the FPC on the first component side, and covers a region on the ground pattern facing at least the signal pad.

12 Claims, 9 Drawing Sheets

OPTICAL MODULE AND OPTICAL TRANSCEIVER

CROSS-REFERENCE TO RELATED APPLICATION

This application is based upon and claims the benefit of priority of the prior Japanese Patent Application No. 2023-090151, filed on May 31, 2023, the entire contents of which are incorporated herein by reference.

FIELD

The embodiments discussed herein are related to an optical module and an optical transceiver.

BACKGROUND

Conventionally, a Mach-Zehnder interferometer is sometimes used as an optical modulator that modulates light generated by a light source. In such an optical modulator, a signal electrode and a ground electrode are provided along parallel optical waveguides. In recent years, optical modulation methods have been diversified. Hence, a plurality of Mach-Zehnder interferometers are increasingly provided in an optical modulator. In this case, by integrating the Mach-Zehnder interferometers on a single chip, the size of the optical modulator can be reduced.

The optical modulator provided with the Mach-Zehnder interferometers can generate multilevel modulation signals when a plurality of different electrical signals are input. That is, when different electrical signals are input to the signal electrode corresponding to each of the Mach-Zehnder interferometers from outside, for example, it is possible to perform optical modulation using a multilevel modulation method such as Differential Quadrature Phase Shift Keying (DQPSK).

An input unit that inputs electrical signals to the optical modulator may be provided with a connector. However, if a connector is provided for each of a plurality of the electrical signals, the size of the optical modulator will be increased, thereby increasing the mounting area. Therefore, a Flexible Printed Circuit (FPC) having flexibility is sometimes used for the input unit that inputs electrical signals to reduce the size of the device.

A plurality of wiring patterns corresponding to a plurality of signal electrodes of the optical modulator are printed on the FPC. Hence, an electrical signal output from the driver is input to the optical modulator via the wiring patterns printed on the FPC. A pad serving as a wide electrode is formed on an end part of the FPC on the driver side. By soldering the electrode on a substrate that transmits electrical signals output from the driver to the pad, the FPC and the driver are electrically connected. On the other hand, for example, at an end part of the FPC on the optical modulator side, when a lead pin that extends from the optical modulator is soldered to the wiring pattern printed on the FPC, the FPC and the optical modulator are electrically connected.

For example, as a wiring pattern printed on the FPC, a microstrip line (hereinafter, simply referred to as an MSL) may be used to transmit high-frequency electrical signals of several ten gigahertz (GHz) or more. Thus, at the end part of the FPC on the driver side, the wide pad is connected to the MSL having a width narrower than the pad. Then, a coverlay may be provided on the surface of the FPC to cover and protect the MSL. The related technologies are described, for example, in: Japanese Laid-open Patent Publication No. 2017-3655 and Japanese Laid-open Patent Publication No. 2007-123741.

However, the outer shape machining accuracy and alignment accuracy of the coverlay are poor, and the tolerance is large. Hence, even if the coverlay is provided on the surface of the FPC, a part of the MSL may be exposed. That is, due to a large manufacturing error of the coverlay, the MSL may be exposed particularly at a portion where the MSL is connected to the pad, and may result in disconnection or the like.

Therefore, a portion of the FPC where the MSL is formed may be reinforced, by increasing the size of the coverlay and also covering a part of the pad. However, in this case, the coverlay is sandwiched between the pad and the electrode on the substrate, and prevents the electrode on the substrate from being soldered to the pad. Then, when a part of the pad is covered by the coverlay and is not soldered, impedance mismatch occurs in the connection portion between the FPC and the substrate.

Specifically, the pad of the FPC is designed such that the characteristic impedance becomes 50Ω when the entire pad is soldered to the electrode on the substrate. However, if the coverlay prevents a part of the pad from being soldered, it becomes difficult to maintain impedance matching. Then, when impedance mismatch occurs, high-frequency reflections at the connection portion between the substrate and the FPC are increased, thereby narrowing the transmission frequency band.

SUMMARY

According to an aspect of an embodiment, an optical module includes a first component, a second component, and a flexible substrate that electrically connects the first component and the second component. The flexible substrate includes a signal pad at least a part of which is fixed to the first component, a ground pad at least a part of which is fixed to the first component. The flexible substrate includes a signal line, a ground pattern, a first coverlay and a second coverlay. The signal line is formed on a first surface of the flexible substrate and connects the signal pad and the second component, the signal line having a width narrower than the signal pad. The ground pattern is formed on a second surface serving as a rear surface of the first surface. The first coverlay includes a first protrusion part that is formed on the first surface, covers a region on the flexible substrate where the signal line is disposed, and protrudes at a location where the signal pad is disposed, toward an end part of the flexible substrate on the first component side than the region where the signal line is disposed. The second coverlay includes a second protrusion part that is formed on the second surface, protrudes at a location where the signal pad is disposed, toward an end part of the flexible substrate on the first component side, and covers a region on the ground pattern facing at least the signal pad.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. However, the present invention is not limited to the embodiments.

(a) First Embodiment

Figure 1:
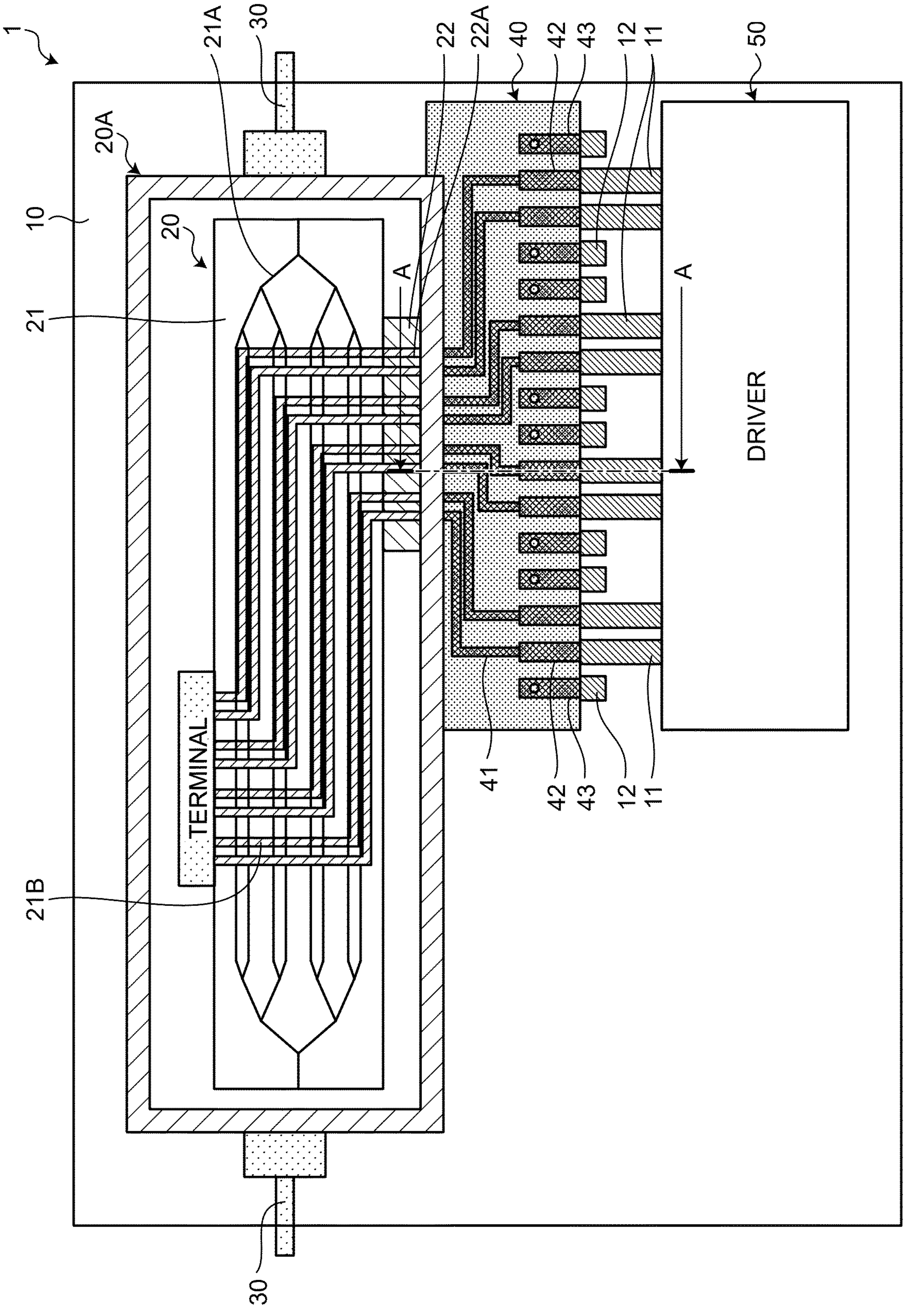
FIG. 1 is a schematic plan view illustrating an example of a configuration of an optical module of a first embodiment.

FIG. 1 is a schematic plan view illustrating an example of a configuration of an optical module 1 of a first embodiment. The optical module 1 illustrated in FIG. 1 includes a Printed Circuits Board (PCB) 10, an optical modulator 20, an optical fiber 30, an FPC 40, and a driver 50.

For example, the PCB 10 is a glass epoxy substrate or the like, and is a component that serves as a substrate on which various components that make up the optical module 1 are mounted. On the surface of the PCB 10, a signal electrode 11 and a ground electrode 12 that are electrodes for electrically connecting various components are printed.

The optical modulator 20 modulates and outputs light from the optical fiber 30. The optical modulator 20 performs optical modulation on the basis of an electrical signal output from the driver 50. Specifically, the optical modulator 20 includes a modulator chip 21 and a relay substrate 22. The optical modulator 20 is housed in a package 20A.

The modulator chip 21 includes parallel optical waveguides 21A and an electrode 21B such as a signal electrode and a ground electrode, and performs optical modulation using an electrical signal supplied to the signal electrode, while propagating light from the optical fiber 30 through the optical waveguides 21A. Specifically, for example, the optical waveguides 21A are formed, by forming a metal film such as titanium (Ti) on a part of a crystal substrate made of electro-optic crystals such as lithium niobate ($LiNbO_3$ (LN)), lithium tantalate ($LiTaO_2$), and the like, and thermally diffusing the metal film. Moreover, the optical waveguides 21A may also be formed by exchanging protons in benzoic acid after patterning.

The electrode 21B such as a signal electrode and a ground electrode is a coplanar electrode formed along the parallel optical waveguides 21A. For example, the signal electrode and the ground electrode are patterned on each of the optical waveguides 21A. Then, a buffer layer is provided between the crystal substrate and the signal electrode and ground electrode, to prevent light propagating through the optical waveguide 21A from being absorbed by the signal electrode and ground electrode. For example, the buffer layer may be silicon dioxide ($SiO_2$) with thickness of about 0.2 to 2 μm or the like.

The relay substrate 22 relays the electrical signal output from the driver 50 to the modulator chip 21, and inputs the electrical signal to the signal electrode of the modulator chip 21. In FIG. 1, the relay substrate 22 has a wiring pattern 22A corresponding to the optical waveguide 21A formed on the modulator chip 21. To input an electrical signal into a plurality of the signal electrodes formed on the modulator chip 21, if all the input units that input electrical signals are arranged on one side of the optical modulator 20, the mounting becomes easy, and the mounting area will be reduced. Therefore, in the present embodiment, the relay substrate 22 is disposed on the optical modulator 20, and the relay substrate 22 relays the electrical signals input from one side of the optical modulator 20 to the modulator chip 21.

The FPC 40 is a flexible substrate having flexibility, and supplies an electrical signal output from the driver 50 to the optical modulator 20. That is, one end of the FPC 40 is electrically connected to the relay substrate 22 of the optical modulator 20, and the other end of the FPC 40 is connected to the driver 50 via the electrode on the PCB 10. FIG. 1 illustrates a GSSG structure in which a pair of signal pads 42 and a pair of ground pads 43 are formed on an end part 40C of the FPC 40 connected to the PCB 10, and the pair of signal pads 42 are sandwiched between the pair of ground pads 43. For the sake of convenience, as an example, the GSSG structure is illustrated. However, it is not limited thereto. A GSG structure or the like may also be used, and may be changed as appropriate.

As will be described below, each of the signal pads 42 and ground pads 43 is formed on both surfaces of the FPC 40 via through holes 44 and 45. Then, a signal pad 42B (42) and a ground pad 43B (43) formed on an FPC front surface that is a surface of the FPC 40 facing the PCB 10, are soldered to the signal electrode 11 and the ground electrode 12 on the PCB 10. For example, the signal electrode 11 and the ground electrode 12 are RF electrodes. Moreover, on the surface of the FPC 40 facing the PCB 10 (FPC front surface), a microstrip line (hereinafter, simply referred to as an MSL) 41 is formed to connect the signal pad 42 with the wiring pattern 22A of the relay substrate 22.

On the other hand, a planar ground pattern 46 commonly connected to each ground pad 43 is formed on an FPC rear surface that is a surface of the FPC 40 on the side further away from the PCB 10. In the following description, the FPC front surface of the FPC 40 is referred to as a "signal surface", and the FPC rear surface of the FPC 40 is referred to as a "ground surface". That is, the surface on which the MSL 41 is formed is referred to as the signal surface, and the surface on which the ground pattern 46 is formed is referred to as the ground surface.

The driver 50 generates high-frequency electrical signals to modulate the light from the optical fiber 30. That is, the driver 50 generates an electrical signal the amplitude and phase of which depend on transmission data, and drives the optical modulator 20 with the electrical signal. The driver 50 is connected to the signal electrode 11 on the PCB 10.

Figure 2:
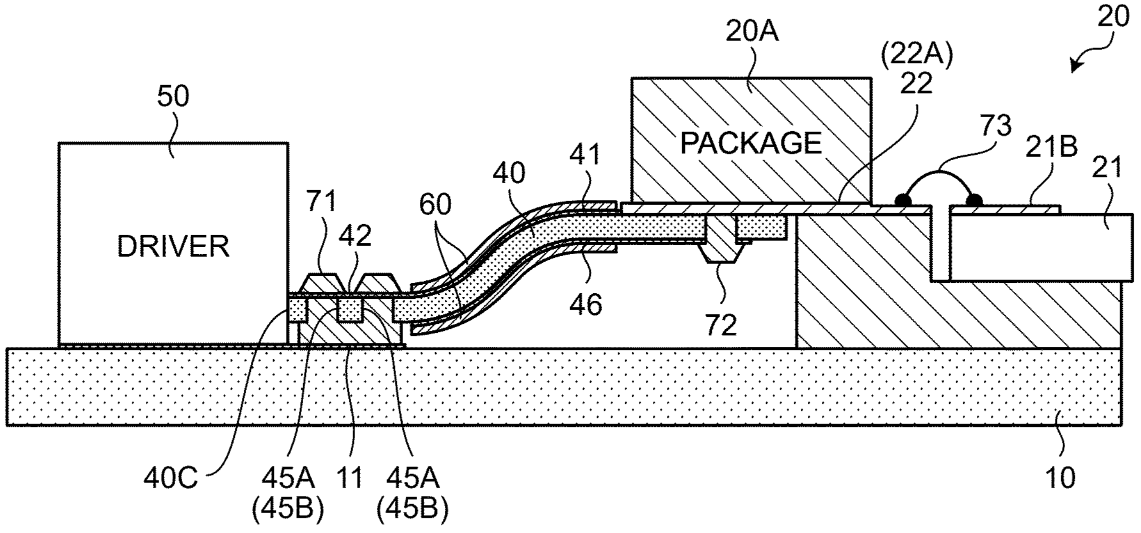
FIG. 2 is a schematic cross-sectional view illustrating an example of a portion taken along the line A-A illustrated in FIG. 1.

Next, with reference to FIG. 2, the connection between the FPC 40 and the signal electrode 11 and the ground electrode 12 on the PCB 10 will be described. FIG. 2 is a schematic cross-sectional view illustrating an example of a portion taken along the line A-A illustrated in FIG. 1.

As illustrated in FIG. 2, the optical modulator 20 and the driver 50 are mounted on the PCB 10, and the signal electrode 11 that extends from the driver 50 is printed on the surface of the PCB 10. Then, the end part 40C of the FPC 40 is soldered to the signal electrode 11, and the other end of the FPC 40 is connected to the optical modulator 20. Hence, the electrical signal output from the driver 50 can be transmitted to the optical modulator 20.

At the connection portion between the signal electrode 11 printed on the surface of the PCB 10 and the end part 40C of the FPC 40, the signal electrode 11 printed on the surface of the PCB 10 and the signal pad 42 formed on the end part of the FPC 40 are soldered by solder 71. The signal pad 42 is a wide electrode disposed on the signal surface and the ground surface of the FPC 40, and connects the signal surface and the ground surface by through holes 45A and 45B. Therefore, the solder 71 used for soldering the signal electrode 11 with the signal pad 42 on the signal surface overflows to the ground surface via the through holes 45A and 45B.

On the ground surface, the ground pattern 46 is connected to the ground pad 43. On the other hand, on the signal surface, the ground pad 43 is not connected to another electrode. The FPC 40 is soldered to the relay substrate 22 with solder 72, and electrically connects the MSL 41 on the signal surface of the FPC 40 and the wiring pattern 22A on the relay substrate 22. Moreover, the wiring pattern 22A of the relay substrate 22 is electrically connected to the electrode 21B on the modulator chip 21 using a wire 73.

Figure 3:
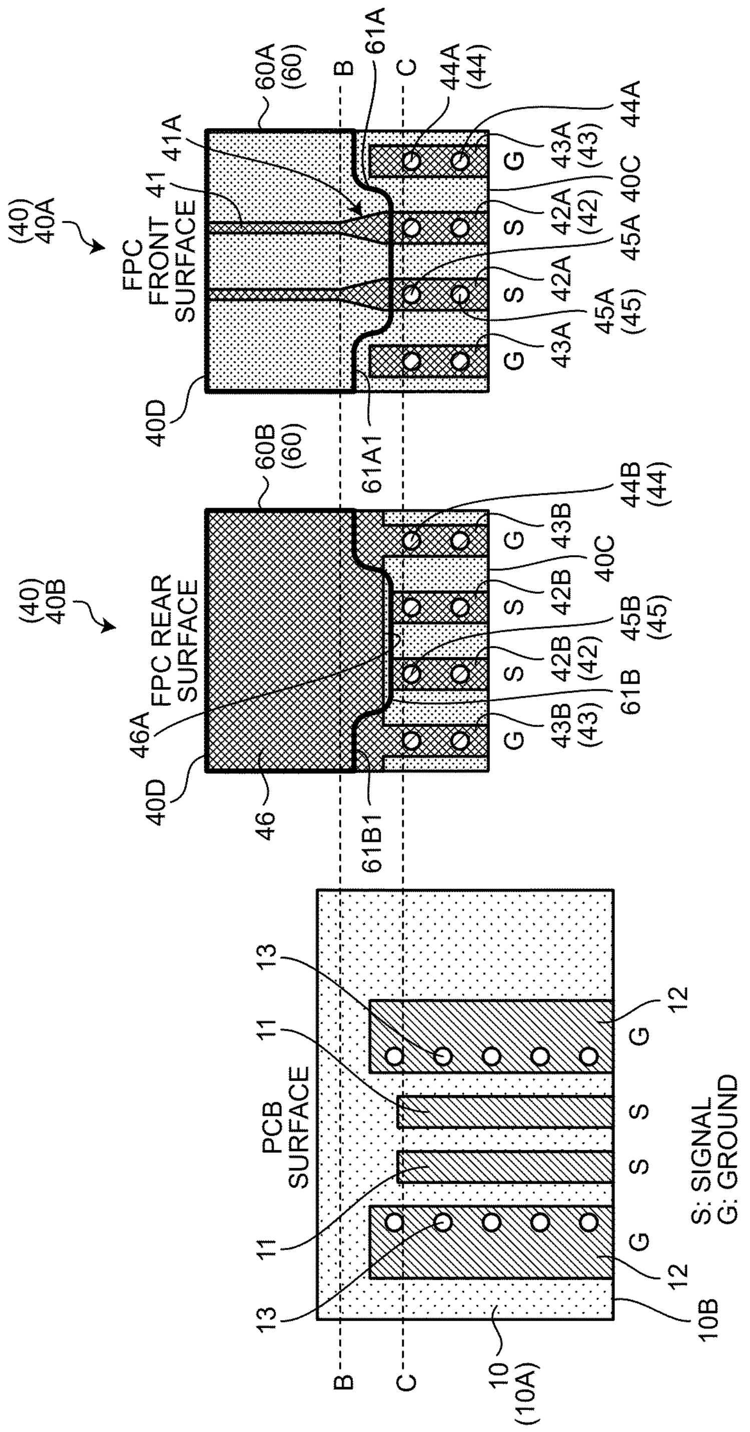
FIG. 3 is an explanatory diagram illustrating an example of electrodes in a connection part between a PCB and an FPC relating to the optical module of the first embodiment.
Figure 4A:
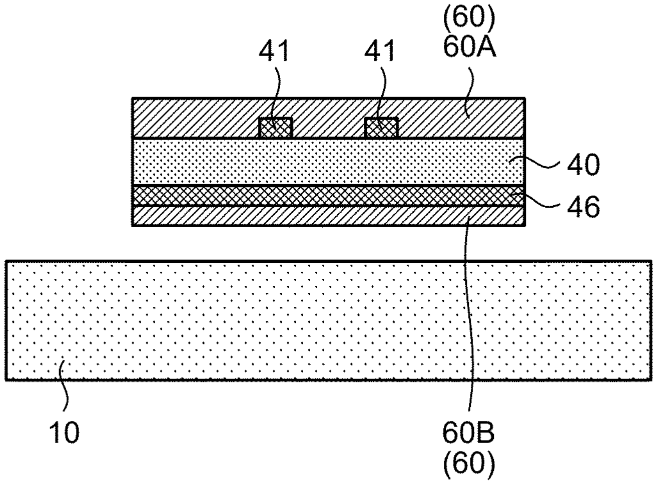
FIG. 4A is a schematic cross-sectional view illustrating an example of a portion taken along the line B-B illustrated in FIG. 3.
Figure 4B:
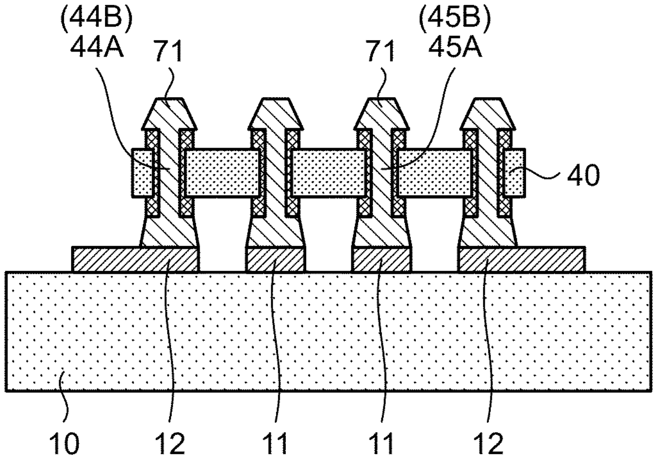
FIG. 4B is a schematic cross-sectional view illustrating an example of a portion taken along the line C-C illustrated in FIG. 3.

FIG. 3 is an explanatory diagram illustrating an example of electrodes in a connection part between the PCB 10 and the FPC 40 relating to the optical module 1 of the first embodiment. FIG. 4A is a schematic cross-sectional view illustrating an example of a portion taken along the line B-B illustrated in FIG. 3. FIG. 4B is a schematic cross-sectional view illustrating an example of a portion taken along the line C-C illustrated in FIG. 3. In FIG. 3, an example of arrangement of electrodes on a surface 10A of the PCB 10, a ground surface 40B of the FPC 40, and a signal surface 40A of the FPC 40 is illustrated. That is, a pair of the signal electrodes 11 disposed on the surface 10A of the PCB 10, a pair of signal pads 42A disposed on the signal surface 40A of the FPC 40, and a pair of signal pads 42B disposed on the ground surface 40B are soldered. Moreover, a pair of the ground electrodes 12 disposed on the surface 10A of the PCB 10, a pair of ground pads 43A disposed on the signal surface 40A, and a pair of the ground pads 43B disposed on the ground surface 40B are soldered. In FIG. 3, "G" indicates a ground electrode or pad, and "S" indicates a signal electrode or pad. A first coverlay 60A covers a portion of the signal surface 40A of the FPC 40, where the MSL 41 is disposed.

On the surface 10A of the PCB 10, the pair of signal electrodes 11 are printed, and the pair of ground electrodes 12 are printed so as to sandwich the pair of signal electrodes 11 therebetween. The ground electrode 12 may be connected to a layer of ground electrode inside the PCB 10 via a through hole 13.

On the ground surface 40B of the FPC 40, the pair of signal pads 42B that extend from the end part 40C toward the center are disposed, and the pair of ground pads 43B are disposed so as to sandwich the pair of signal pads 42B therebetween. The pair of ground pads 43B also extend from the end part 40C of the ground surface 40B of the FPC 40 toward the center, and the tip end thereof is connected to the ground pattern 46.

On the signal surface 40A of the FPC 40, the pair of signal pads 42A that extend from the end part 40C toward the center are disposed, and the pair of ground pads 43A are disposed so as to sandwich the pair of signal pads 42A therebetween. The tip end of the pair of signal pads 42A is connected to the MSL 41. Moreover, the connection portion between the pair of signal pads 42A and the MSL 41 varies in a tapered shape, and forms a tapered signal line 41A the shape of which is tapered toward the MSL 41.

For example, a coverlay 60 is a reinforcement member manufactured by molding polyimide resin or the like, and includes the first coverlay 60A and a second coverlay 60B. As illustrated in FIG. 4A, the first coverlay 60A covers the region on the signal surface 40A of the FPC 40 where the MSL 41 is disposed. The first coverlay 60A covers from an end part 40D of the signal surface 40A on the optical modulator 20 side (upper part in FIG. 3) up to the vicinity of the site that is separated from the tip end of the ground pad 43A. Moreover, the first coverlay 60A has a first protrusion part 61A that covers the tapered signal line 41A near the signal pad 42A. That is, the first protrusion part 61A protrudes from the vicinity of the site that is separated from the tip end of the ground pad 43A toward the end part 40C of the FPC 40 on the driver 50 side, and covers the tapered signal line 41A that is a part of the signal pad 42A. Although the first coverlay 60A covers up to the vicinity of the site that is separated from the tip end of the ground pad 43A, as illustrated in FIG. 3, the first coverlay 60A does not cover the ground pad 43A and the signal pad 42A themselves.

Moreover, as illustrated in FIG. 4A, the second coverlay 60B covers the region on the ground surface 40B of the FPC 40 where the ground pattern 46 is disposed. The second coverlay 60B has a second protrusion part 61B that covers the ground surface 40B on the rear surface of the tapered signal line 41A on the signal surface 40A, from the end part 40D of the ground surface 40B on the optical modulator 20 side (upper part in FIG. 3). The second protrusion part 61B protrudes from the vicinity of the ground pattern 46 that is separated from the tip end of the ground pad 43B toward the end part 40C of the FPC 40 on the driver 50 side, and covers the ground surface 40B on the rear surface of the tapered signal line 41A that is a part of the signal pad 42B. Although the second coverlay 60B covers up to the vicinity of the ground pattern 46 that is separated from the tip end of the ground pad 43B, as illustrated in FIG. 4B, the second coverlay 60B does not cover the ground pad 43B and the signal pad 42B themselves.

Because the coverlay 60 has such a shape, even when the manufacturing error of the coverlay 60 is relatively large, the MSL 41 and the narrow portion at the tip end of the tapered signal line 41A are covered by the first protrusion part 61A of the first coverlay 60A without fail. Therefore, the vicinity of the tapered signal line 41A is reinforced, and the possibility of disconnection of the MSL 41 can be reduced. The second protrusion part 61B of the second coverlay 60B covers the ground pattern 46 of the FPC 40. Hence, it is possible to avoid a situation such as a short circuit caused by solder flowing between the signal pad 42B on the ground surface 40B of the FPC 40 and the ground pattern 46.

Moreover, the shape of the coverlay 60 allows the entire ground pad 43 to be soldered to the ground electrode 12 printed on the surface 10A of the PCB 10. Therefore, the entire ground pad 43 is fixed to the PCB 10, and even if the FPC 40 is bent, the vicinity of the tapered signal line 41A hardly bends. As a result, it is possible to reduce the bending stress applied to the vicinity of the tapered signal line 41A, and suppress the MSL 41 from being disconnected around the vicinity. Furthermore, because the tapered signal line 41A is formed in a tapered shape, the stress is not concentrated on one point. Hence, the possibility of disconnection of the MSL 41 can be further reduced.

Still furthermore, the coverlay 60 has the first protrusion part 61A and the second protrusion part 61B. Hence, the signal pad 42 is soldered to the signal electrode 11 on the surface 10A of the PCB 10 at a portion excluding the tapered signal line 41A. Thus, the positions of the tip ends of the first protrusion part 61A and the second protrusion part 61B are substantially the same as the position of the tip end of the signal electrode 11. In this case, because the tapered signal line 41A is not soldered, the characteristic impedance at this portion may deviate from 50Ω, and may cause impedance mismatch. Impedance matching can be achieved by adjusting the size of the ground pattern 46, and bringing the electrode at the ground voltage close to the tapered signal line 41A.

By adjusting the amount of the ground pattern 46 extending toward the signal pad 42 than the position of the tip end of the portion excluding the first protrusion part 61A and the second protrusion part 61B of the coverlay 60, it is possible to adjust the strength of electrical coupling between the tapered signal line 41A and the ground pattern 46. As a result, it is possible to adjust the characteristic impedance of the tapered signal line 41A to 50Ω, and achieve impedance matching. By achieving impedance matching, it is possible to increase the transmission frequency band, by suppressing high-frequency reflections at the connection portion between the PCB 10 and the tapered signal line 41A of the FPC 40.

The coverlay 60 has the first protrusion part 61A and the second protrusion part 61B. Because the tapered signal line 41A is covered while the ground pad 43 is not covered, it is possible to reinforce the tapered signal line 41A while sufficiently increasing the soldering area. Therefore, it is possible to protect the tapered signal line 41A and suppress the MSL 41 from being disconnected. Moreover, by adjusting the size of the ground pattern 46, it is possible to adjust the strength of electrical coupling between the tapered signal line 41A and the ground pattern 46, and achieve impedance matching. In other words, it is possible to reinforce the wiring pattern on the FPC 40, while maintaining impedance matching.

The optical module 1 of the first embodiment includes the first coverlay 60A including the first protrusion part 61A and the second coverlay 60B including the second protrusion part 61B. The first protrusion part 61A is formed on the signal surface 40A, covers the region on the FPC 40 where the MSL 41 is disposed, and at the location where the signal pad 42 is disposed, protrudes toward the end part 40C of the FPC 40 on the driver 50 side than the region where the MSL 41 is disposed. Furthermore, the first protrusion part 61A covers the MSL 41, except the vicinity of the boundary between the first protrusion part 61A and the ground pad 43. As a result, it is possible to prevent the MSL 41 from being disconnected, while preventing the MSL 41 from being exposed due to misalignment of the first coverlay 60A.

The second protrusion part 61B is formed on the ground surface 40B, and at the location where the signal pad 42 is disposed, the second protrusion part 61B protrudes toward the end part 40C of the FPC 40 on the driver 50 side. Moreover, the second protrusion part 61B covers a region on the ground pattern 46 facing at least the signal pad 42, except the vicinity of the boundary between the second protrusion part 61B and the ground pad 43. As a result, because the second protrusion part 61B covers the ground pattern 46, it is possible to prevent a short-circuit from occurring between the ground pattern 46 and the signal pad 42 on the FPC rear surface during solder bonding.

Furthermore, on the ground surface 40B of the FPC 40, the impedance is adjusted by adjusting the size of the ground pattern 46, and adjusting the strength of electrical coupling between the ground pattern 46 and the tapered signal line 41A on the signal surface 40A of the FPC 40. As a result, while maintaining impedance matching, it is possible to reduce the possibility of disconnection of the MSL 41, by soldering the entire ground pad 43 to the ground electrode 12 on the surface of the PCB 10, and reducing the bending stress applied to the tapered signal line 41A. In other words, it is possible to reinforce the wiring pattern on the FPC 40, while maintaining impedance matching.

The first protrusion part 61A of the first coverlay 60A covers the MSL 41 and at least a part of the tapered signal line 41A. It is possible to prevent the MSL 41 and the tapered signal line 41A from being disconnected, while preventing the MSL 41 and the tapered signal line 41A from being exposed.

The tip end of the ground electrode 12 on the surface 10A of the PCB 10 is located closer to the optical modulator 20 than the tip end of the signal electrode 11 on the surface 10A. As a result, it is possible to increase the soldering area where the ground pad 43B of the FPC 40 is soldered to the ground electrode 12 on the surface 10A of the PCB. Moreover, it is possible to prevent the electrode from being disconnected, caused when the FPC 40 is bent by an opening part 61A1 formed by the first protrusion part 61A and an opening part 61B1 formed by the second protrusion part 61B.

The outer surface shape of the first coverlay 60A that covers the signal surface 40A of the FPC 40 and the outer surface shape of the second coverlay 60B that covers the ground surface 40B of the FPC 40 are formed substantially the same, to join the first coverlay 60A with the second coverlay 60B. As a result, the manufacturing cost of the coverlay 60 can be reduced by commonly using the coverlay 60.

An end 46A of the ground pattern 46 provided on the ground surface 40B of the FPC 40 is located on the driver 50 side than the connection portion between the MSL 41 and the tapered signal line 41A provided on the signal surface 40A. As a result, the impedance can be adjusted.

The MSL 41 is a signal line that transmits high-frequency electrical signals. As a result, it is possible to reduce the high-frequency reflections at the connection portion between the PCB 10 and the FPC 40, and increase transmission frequency band.

In the FPC 40 of the optical module 1 in the first embodiment, as an example, the pair of signal pads 42A and the pair of ground pads 43A extend from the end part 40C toward the center. However, the configuration is not limited thereto. In addition to extending from the end part 40C, the pair of signal pads 42A and the pair of ground pads 43A may also extend from an end surface other than the end part 40C of the signal surface 40A, and may be changed as appropriate.

In the FPC 40 of the optical module 1 in the first embodiment, the position of the through hole 44 of the ground pad 43 may be changed, and an embodiment thereof will be described below as a second embodiment. The same reference numerals are assigned to the same components as those in the optical module 1 of the first embodiment, and descriptions of overlapping configurations and operations will be omitted.

(b) Second Embodiment

Figure 5:
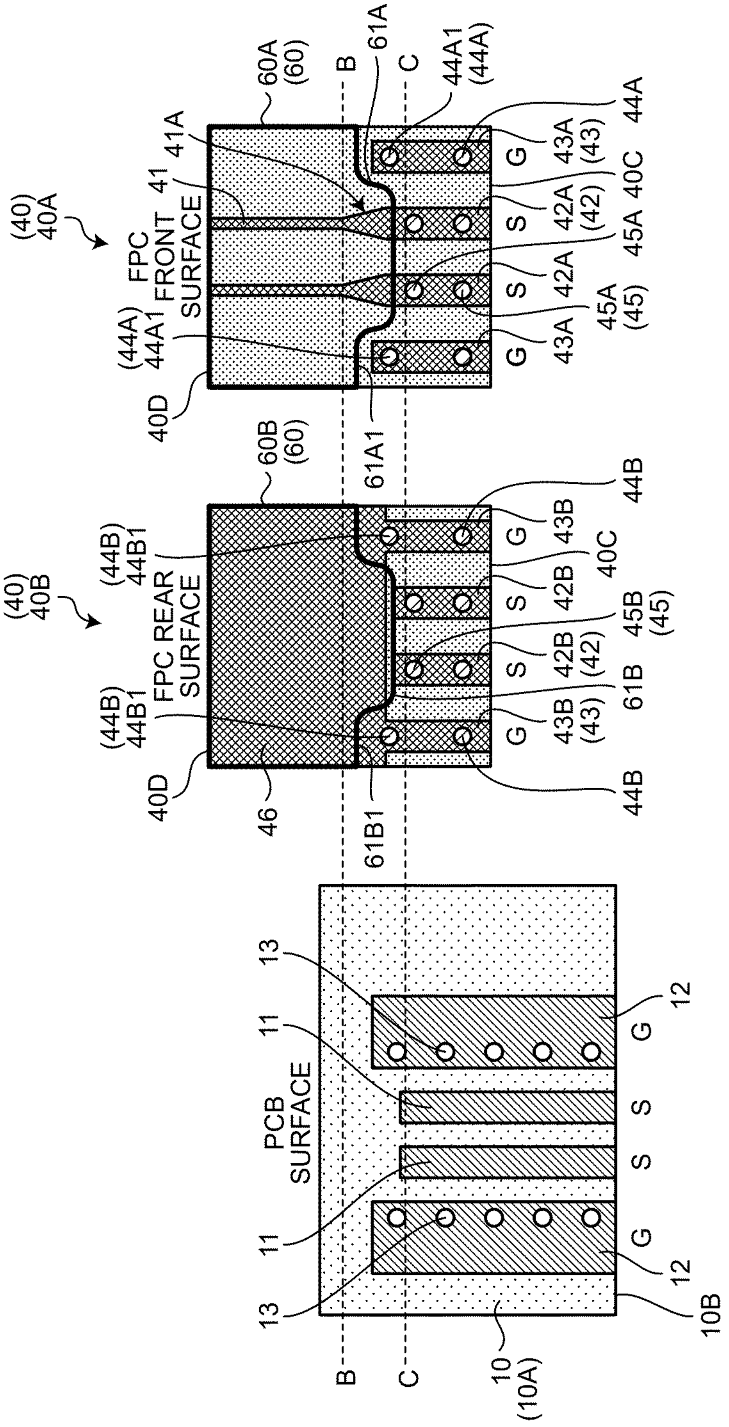
FIG. 5 is an explanatory diagram illustrating an example of electrodes in the connection part between the PCB and the FPC relating to an optical module of a second embodiment.

FIG. 5 is an explanatory diagram illustrating an example of electrodes in the connection part between the PCB 10 and the FPC 40 relating to the optical module 1 of a second embodiment. A through hole 44A1 is formed on the ground pad 43A on the signal surface 40A illustrated in FIG. 5, at a location adjacent to the first protrusion part 61A. A through hole 44B1 is formed on the ground pad 43B on the ground surface 40B, at a location adjacent to the second protrusion part 61B. In the signal surface 40A of the FPC 40, the distance from the end part 40C on the driver 50 side to the through hole 44A1 on the optical modulator 20 side of the ground pad 43A that extends toward the center, is made longer than the distance from the end part 40C to the through hole 45A on the optical modulator 20 side of the signal pad 42A. Among a plurality of the through holes 44A that penetrate through the ground pad 43A, the through hole 44A1 on the optical modulator 20 side is the through hole farthest away from the end part 40C on the driver 50 side.

In the ground surface 40B of the FPC 40, the distance from the end part 40C on the driver 50 side to the through hole 44B1 on the optical modulator 20 side of the ground pad 43B that extends toward the center is made longer than the distance from the end part 40C to the through hole 45B on the optical modulator 20 side of the signal pad 42B. Among a plurality of the through holes 44B that penetrate through the ground pad 43B, the through hole 44B1 on the optical modulator 20 side is the through hole farthest away from the end part 40C on the driver 50 side.

That is, the through holes 44A1 and 44B1 are through holes in which an electrode is attached, and the strength is higher by the electrode attached to the inside. Therefore, by providing the through holes 44A1 and 44B1 at the location adjacent to the tapered signal line 41A, the vicinity of the tapered signal line 41A is reinforced. As a result, in bending the FPC 40, the vicinity of the tapered signal line 41A is further prevented from being bent by the opening part 61A1 and the opening part 61B1. Hence, it is possible to suppress the MSL 41 from being disconnected.

In the second embodiment, the through hole 44A1 on the optical modulator 20 side of the ground pad 43A and the through hole 44B1 on the optical modulator 20 side of the ground pad 43B are disposed in the vicinity of the tapered signal line 41A connected to the MSL 41. By checking the solder creeping up through the through holes 44A1 and 44B1, it is possible to determine that the ground pads 43 on both sides of the tapered signal line 41A are fixed. As a result, the tapered signal line 41A of the FPC 40 is prevented from being bent by the opening parts 61A1 and 61B1 of the coverlay 60 when mounted. Hence, it is possible to suppress the MSL 41 from being disconnected.

In the FPC 40 of the second embodiment, as an example, the widths of the ground pad 43 and the signal pad 42 are made the same. However, it is not limited thereto, and an embodiment thereof will be described below as a third embodiment. The same reference numerals are assigned to the same components as those in the optical module 1 of the second embodiment, and descriptions of overlapping configurations and operations will be omitted.

(c) Third Embodiment

Figure 6:
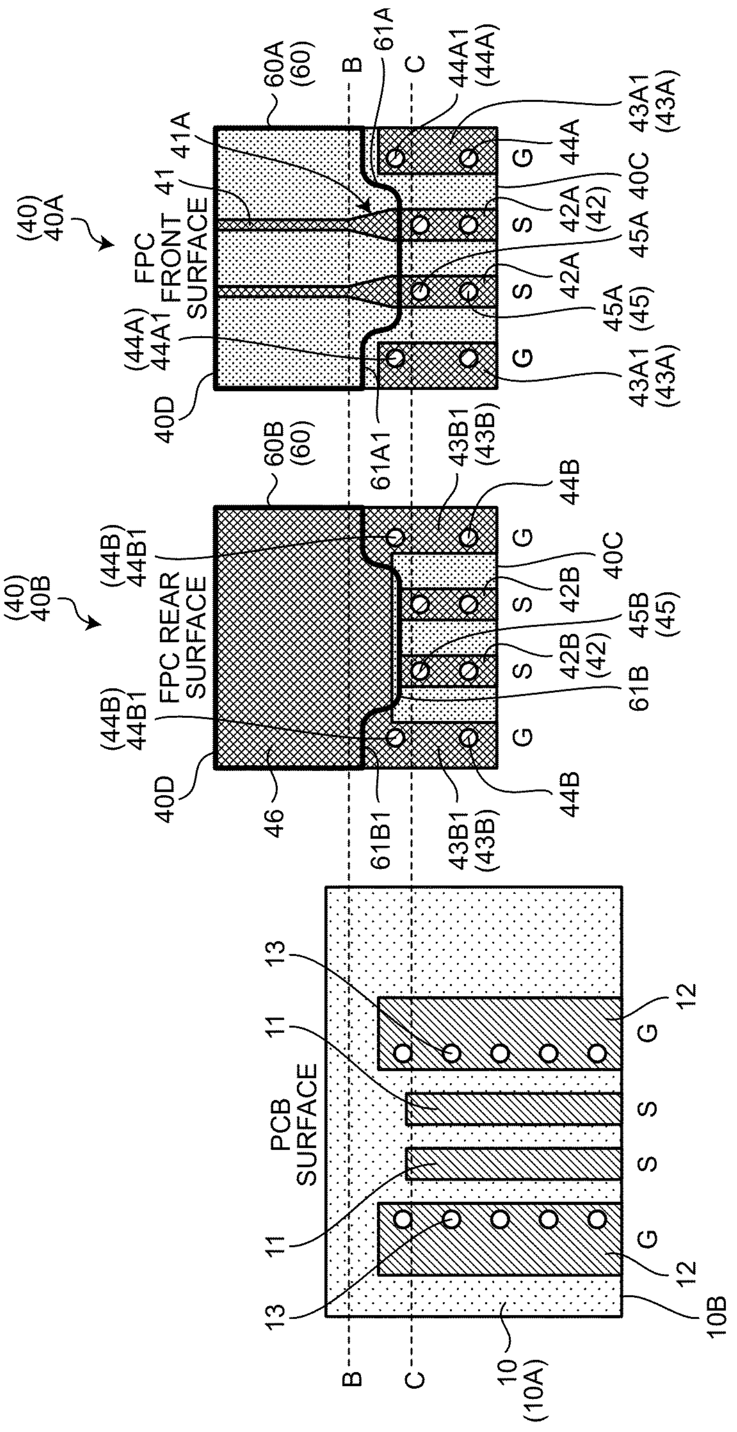
FIG. 6 is an explanatory diagram illustrating an example of electrodes in the connection part between the PCB and the FPC relating to an optical module of a third embodiment.

FIG. 6 is an explanatory diagram illustrating an example of electrodes in a connection part between the PCB 10 and the FPC 40 relating to the optical module 1 of the third embodiment. The width of a ground pad 43B1 on the ground surface 40B illustrated in FIG. 6 is formed wider than the width of the signal pad 42B on the ground surface 40B. Moreover, the width of a ground pad 43A1 on the signal surface 40A is formed wider than the width of the signal pad 42A on the signal surface 40A.

Furthermore, in the FPC 40 of the third embodiment, the soldering area between the ground electrode 12 on the surface 10A of the PCB 10 and the ground pad 43 is increased, by forming the width of the ground pad 43 wider than the width of the signal pad 42. As a result, the connection strength between the ground pad 43 of the FPC 40 and the ground electrode 12 of the PCB 10 is improved.

In the FPC 40 of the third embodiment, as an example, the shape of the ground pad 43A1 is formed in a square. However, it is not limited thereto, and an embodiment thereof will be described below as a fourth embodiment. The same reference numerals are assigned to the same components as those in the optical module 1 of the third embodiment, and descriptions of overlapping configurations and operations will be omitted.

(d) Fourth Embodiment

Figure 7:
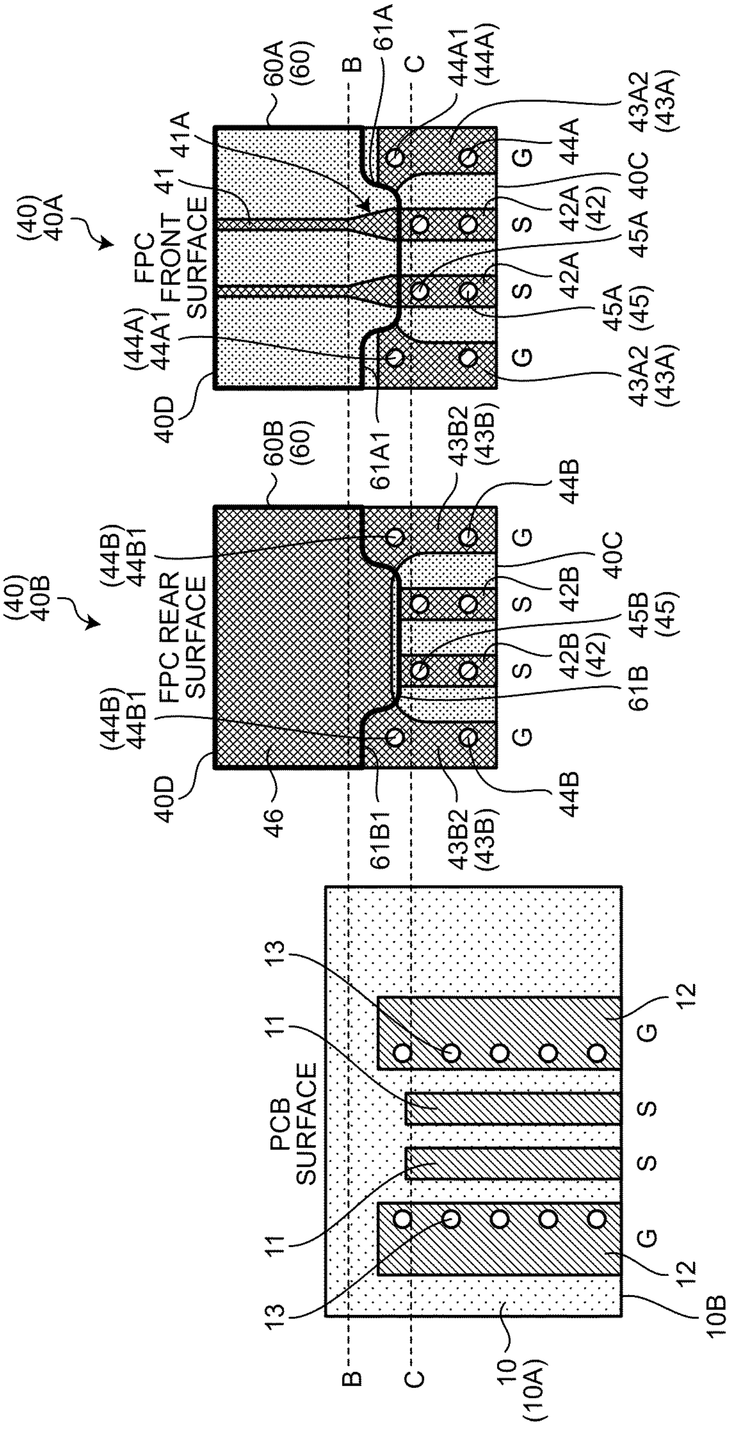
FIG. 7 is an explanatory diagram illustrating an example of electrodes in the connection part between the PCB and the FPC relating to an optical module of a fourth embodiment.

FIG. 7 is an explanatory diagram illustrating an example of electrodes in a connection part between the PCB 10 and the FPC 40 relating to the optical module 1 of the fourth embodiment. A ground pad 43B2 on the ground surface 40B illustrated in FIG. 7 has a shape such that the width increases toward the ground pattern 46, and that bulges toward the signal pad 42B side. A ground pad 43A2 is configured such that the gap between the ground pad 43A2 and the signal pad 42A changes continuously from the end part of the ground pad 43A2 toward the opening part 61A1 of the first coverlay 60A. Moreover, the ground pad 43A2 on the signal surface 40A has a shape such that the width increases toward the tapered signal line 41A of the MSL 41, and that bulges toward the tapered signal line 41A side connected to the MSL 41. The ground pad 43B2 is configured such that the gap between the ground pad 43B2 and the signal pad 42B changes continuously from the end part of the ground pad 43B2 toward the opening part 61B1 of the second coverlay 60B.

In the FPC 40 of the fourth embodiment, the ground pad 43A2 is configured such that the gap between the ground pad 43A2 and the signal pad 42A changes continuously from the end part of the ground pad 43A2 toward the opening part 61A1 of the first coverlay 60A. Moreover, in the FPC 40, the ground pad 43B2 is configured such that the gap between the ground pad 43B2 and the signal pad 42B changes continuously from the end part of the ground pad 43B2 toward the opening part 61B1 of the second coverlay 60B. As a result, the gap between the signal pad 42B (42A) and the ground pad 43B2 (43A2) gradually reduces toward the opening part 61B1 (61A1). Hence, it is possible to eliminate a location where the impedance changes abruptly. Then, it is possible to suppress high-frequency reflections, by adjusting the impedance in the vicinity of the tapered signal line 41A connected to the MSL 41.

In the FPC 40 of the fourth embodiment, the shape of the ground pad 43A2 is such that the width increases toward the tapered signal line 41A of the MSL 41, and that bulges out to the tapered signal line 41A side connected to the MSL 41. Moreover, in the FPC 40, as an example, the shape of the ground pad 43B2 is such that the width increases toward the ground pattern 46, and that bulges out to the signal pad 42B side. However, it is not limited thereto, and an embodiment thereof will be described below as a fifth embodiment. The same reference numerals are assigned to the same components as those in the optical module 1 of the fourth embodiment, and descriptions of overlapping configurations and operations will be omitted.

(e) Fifth Embodiment

Figure 8:
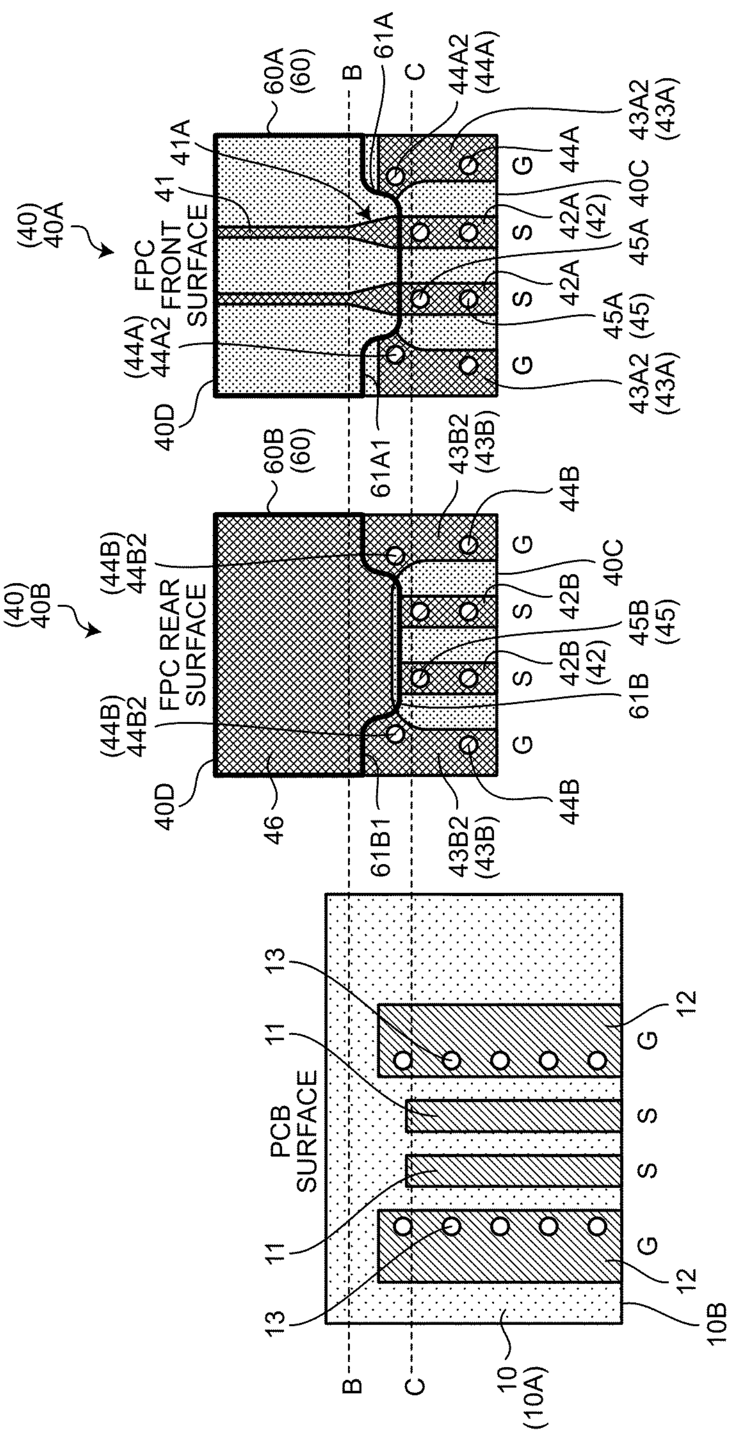
FIG. 8 is an explanatory diagram illustrating an example of electrodes in the connection part between the PCB and the FPC relating to an optical module of a fifth embodiment.

FIG. 8 is an explanatory diagram illustrating an example of electrodes in a connection part between the PCB 10 and the FPC 40 relating to the optical module 1 of the fifth embodiment. The ground pad 43B2 on the ground surface 40B illustrated in FIG. 8 is configured such that the gap between the ground pad 43B2 and the signal pad 42B changes continuously from the end part of the ground pad 43B2 toward the opening part 61B1 of the second coverlay 60B. Moreover, the ground pad 43A2 on the signal surface 40A is configured such that the gap between the ground pad 43A2 and the signal pad 42A changes continuously from the end part of the ground pad 43A2 toward the opening part 61A1 of the first coverlay 60A.

In the signal surface 40A of the FPC 40, a through hole 44A2 on the optical modulator 20 side of the ground pad 43A2 that extends from the end part 40C on the driver 50 side toward the center, is disposed on the signal pad 42 side than the other through hole 44A. In the ground surface 40B of the FPC 40, a through hole 44B2 on the optical modulator 20 side of the ground pad 43B2 that extends from the end part 40C on the driver 50 side toward the center, is disposed on the signal pad 42 side than the other through hole 44B.

In the FPC 40 of the fifth embodiment, the through hole 44A2 on the optical modulator 20 side of the ground pad 43A2 and the through hole 44B2 on the optical modulator 20 side of the ground pad 43B2 are disposed in the vicinity of the tapered signal line 41A connected to the MSL 41. As a result, it is possible to suppress high-frequency reflections, by adjusting the impedance in the vicinity of the tapered signal line 41A connected to the MSL 41.

For the sake of convenience, in the present embodiment, as an example, the surface of the FPC 40 facing the PCB 10 is referred to as the signal surface 40A, and the surface on the side further away from the PCB 10 is referred to as the ground surface 40B. However, the surface facing the PCB 10 may also be referred to as the ground surface 40B, and the surface on the side further away from the PCB 10 may also be referred to as the signal surface 40A. That is, the surface of the FPC 40 facing the PCB 10 may be referred to as a ground surface including the ground pattern 46 and the like, and the surface on the side further away from the PCB 10 may be referred to as a signal surface including the MSL 41 and the like.

Moreover, in the present embodiment, as an example, the connection portion between the signal pad 42 and the MSL 41 is the tapered signal line 41A formed in a tapered shape. However, the connection portion need not be a tapered signal line, and may be changed as appropriate. That is, a thin MSL 41 may be directly connected to a rectangular pad. Even in such a case, the first protrusion part 61A of the first coverlay 60A covers a part of the signal pad 42, and the connection portion is covered without fail. Hence, it is possible to protect the connection portion.

Figure 9:
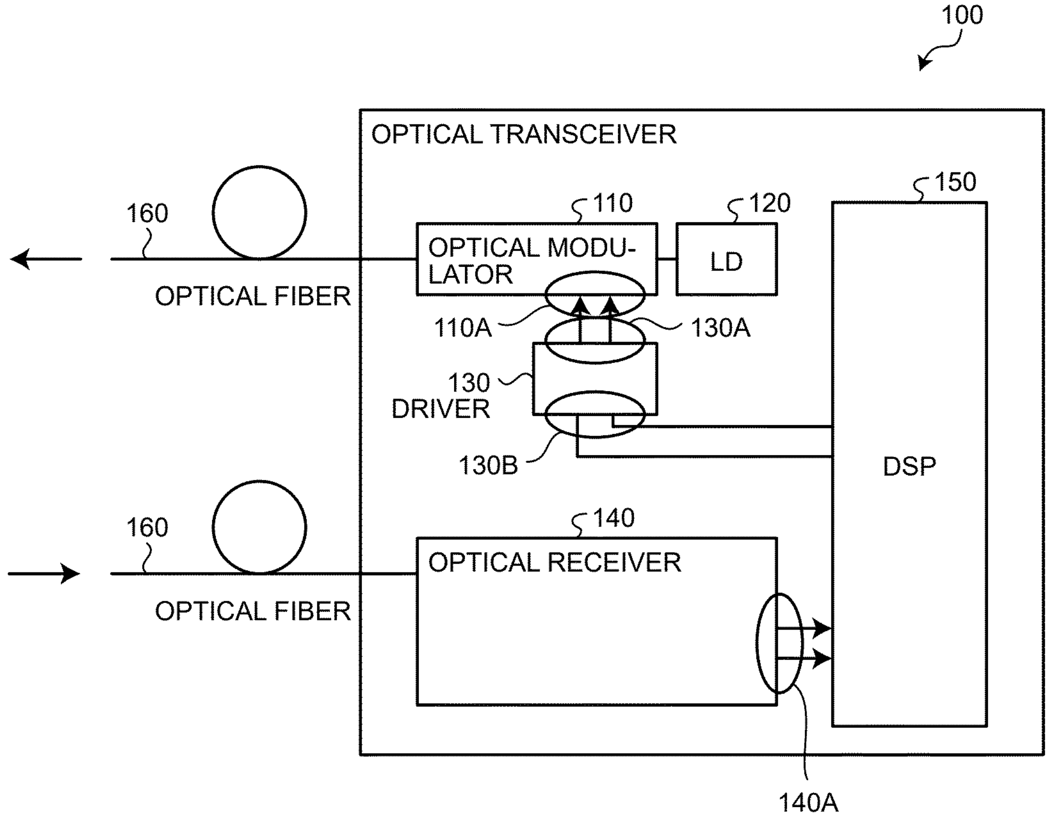
FIG. 9 is a block diagram illustrating an example of an optical transceiver.

Furthermore, for example, the optical module 1 can be applied to an optical transceiver that transmits and receives optical signals. FIG. 9 is a block diagram illustrating an example of an optical transceiver 100. The optical transceiver 100 illustrated in FIG. 9 includes an optical modulator 110, a Laser Diode (LD) 120, a driver 130, an optical receiver 140, a Digital Signal Processor (DSP) 150, and an optical fiber 160.

The optical modulator 110 optically modulates an optical signal from the LD 120 according to the electrical signal from the driver 130, and outputs the optically modulated optical signal to the optical fiber 160. The LD 120 is a light source that supplies the optical signal optically modulated by the optical modulator 110. The optical signal is optically modulated by the optical modulator 110 according to the electrical signal output from the driver 130, and then transmitted as an optical signal.

For example, the DSP 150 performs various digital signal processing such as coding and digital modulation on transmission data, and outputs the obtained transmission signal to the driver 130. The driver 130 converts the transmission signal into a high-frequency electrical signal to modulate light, and the optical modulator 110 is driven by the converted electrical signal.

The optical receiver 140 receives an optical signal from the optical fiber 160, performs predetermined light receiving processing such as photoelectric conversion, and outputs the obtained received signal to the DSP 150. For example, the DSP 150 performs various digital signal processing such as digital demodulation and decoding, on the received signal output from the optical receiver 140.

For example, the optical module 1 in the present embodiment may be disposed in a driver output unit 130A placed between the driver 130 and the optical modulator 110, or in the FPC 40 in an optical modulator input unit 110A. Moreover, the optical module 1 may also be disposed in the FPC 40 in a driver input unit 130B placed between the driver 130 and the DSP 150. Furthermore, the optical module 1 may also be disposed in the FPC 40 in an optical receiver output unit 140A placed between the optical receiver 140 and the DSP 150.

For the sake of convenience, as an example, the optical modulator 110 and the optical receiver 140 are both built in the optical transceiver 100. However, only one of the optical modulator 110 and the optical receiver 140 may be built in the optical transceiver 100. For example, when the optical modulator 110 is built in, the optical transceiver 100 serves as an optical transmission device, and when the optical receiver 140 is built in, the optical transceiver 100 serves as an optical reception device.

Moreover, each component of each unit illustrated in the drawings does not have to be physically configured as illustrated. That is, the specific mode of dispersion and integration of each unit is not limited to those illustrated in the drawings, and all or a part thereof can be functionally or physically dispersed or integrated in an optional unit, depending on various kinds of loads and the status of use.

Furthermore, all or an optional part of the various processing functions carried out in each device may be implemented on a Central Processing Unit (CPU) (or a microcomputer such as a Micro Processing Unit (MPU) or a Micro Controller Unit (MCU)). Still furthermore, it is needless to say that all or any part of various processing functions may be implemented on a computer program analyzed and executed in a CPU (or a microcomputer such as an MPU or an MCU) or on hardware by a wired logic.

According to one aspect of the optical module 1 disclosed in the present application, it is advantageously possible to reinforce the wiring pattern on a flexible substrate, while maintaining impedance matching.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical module, comprising:

a first component;

a second component; and a flexible substrate that electrically connects the first component and the second component, wherein the flexible substrate includes a signal pad at least a part of which is fixed to the first component, a ground pad at least a part of which is fixed to the first component, a signal line that is formed on a first surface of the flexible substrate and connects the signal pad and the second component, the signal line having a width narrower than the signal pad, a ground pattern that is formed on a second surface serving as a rear surface of the first surface, a first coverlay including a first protrusion part that is formed on the first surface, covers a region on the flexible substrate where the signal line is disposed, and protrudes at a location where the signal pad is disposed, toward an end part of the flexible substrate on a side of the first component as a first component side than the region where the signal line is disposed, and a second coverlay including a second protrusion part that is formed on the second surface, protrudes at a location where the signal pad is disposed, toward an end part of the flexible substrate on the first component side, and covers a region on the ground pattern facing at least the signal pad, except a vicinity of a boundary between the second protrusion part and the ground pad.

2. The optical module according to claim 1, wherein the flexible substrate includes a tapered signal line that is formed on the first surface and joins the signal line with the signal pad, the tapered signal line having a width varying in a tapered shape, and the first protrusion part covers the signal line and at least a part of the tapered signal line.

3. The optical module according to claim 1, including:

a substrate that is connected to the flexible substrate, wherein the substrate includes a signal electrode that is connected to the signal pad of the flexible substrate, and a ground electrode that is connected to the ground pad of the flexible substrate, and a tip end of the ground electrode on a side of the second component as a second component side is located closer to the second component than a tip end of the signal electrode on the second component side.

4. The optical module according to claim 1, wherein an outer surface shape of the first coverlay and an outer surface shape of the second coverlay have a same shape, and a coverlay is formed by joining the first coverlay with the second coverlay.

5. The optical module according to claim 2, wherein a tip end of the ground pattern on the first component side is located closer to the signal pad than a connection site where the tapered signal line and the signal line are connected.

6. The optical module according to claim 1, including:

a plurality of first through holes that penetrate through the signal pad, and a plurality of second through holes that penetrate through the ground pad, wherein among the plurality of second through holes, a second through hole farthest away from an end part on the first component side is located further away from the end part on the first component side than a first through hole among the plurality of first through holes.

7. The optical module according to claim 1, wherein width of the ground pad is formed wider than width of the signal pad.

8. The optical module according to claim 3, wherein the ground pad has a configuration in which a width of the ground pad is increased such that a gap between the ground pad and the signal pad approaches continuously from an end part on the first component side toward the second component side.

9. The optical module according to claim 8, including:

a plurality of first through holes that penetrate through the signal pad, and a plurality of second through holes that penetrate through the ground pad, wherein among the plurality of second through holes, a second through hole farthest away from an end part on the first component side is located further away from the end part on the first component side than a first through hole among the plurality of first through holes.

10. The optical module according to claim 1, wherein the signal line is a signal line that transmits a high-frequency electrical signal.

11. An optical transmission device, comprising:

an optical modulator that is configured to optically modulate light according to an electrical signal;

a driver that is configured to output the electrical signal; and a flexible substrate that electrically connects the optical modulator and the driver, wherein the flexible substrate includes a signal pad at least a part of which is fixed to the driver, a ground pad at least a part of which is fixed to the driver, a signal line that is formed on a first surface of the flexible substrate and connects the signal pad and the optical modulator, the signal line having a width narrower than the signal pad, a ground pattern that is formed on a second surface serving as a rear surface of the first surface, a first coverlay including a first protrusion part that is formed on the first surface, covers a region on the flexible substrate where the signal line is disposed, and protrudes at a location where the signal pad is disposed, toward an end part of the flexible substrate on a side of the driver as a driver side than the region where the signal line is disposed, and a second coverlay including a second protrusion part that is formed on the second surface, protrudes at a location where the signal pad is disposed, toward an end part of the flexible substrate on the driver side, and covers a region on the ground pattern facing at least the signal pad, except a vicinity of a boundary between the second protrusion part and the ground pad.

12. An optical reception device, comprising:

an optical receiver that is configured to convert received light into an electrical signal;

a signal processor that is configured to perform signal processing on the converted electrical signal; and a flexible substrate that electrically connects the optical receiver and the signal processor, wherein the flexible substrate includes a signal pad at least a part of which is fixed to the signal processor, a ground pad at least a part of which is fixed to the signal processor, a signal line that is formed on a first surface of the flexible substrate and connects the signal pad and the optical receiver, the signal line having a width narrower than the signal pad, a ground pattern that is formed on a second surface serving as a rear surface of the first surface, a first coverlay including a first protrusion part that is formed on the first surface, covers a region on the flexible substrate where the signal line is disposed, and protrudes at a location where the signal pad is disposed, toward an end part of the flexible substrate on a side of the signal processor as a signal processor side than the region where the signal line is disposed, and a second coverlay including a second protrusion part that is formed on the second surface, protrudes at a location where the signal pad is disposed, toward an end part of the flexible substrate on the signal processor side, and covers a region on the ground pattern facing at least the signal pad, except a vicinity of a boundary between the second protrusion part and the ground pad.

* * * * *